US00RE39939E

(19) United States
(12) Reissued Patent
Okayama et al.

(10) Patent Number: US RE39,939 E
(45) Date of Reissued Patent: Dec. 18, 2007

(54) PROCESSING SYSTEM

(75) Inventors: Nobuyuki Okayama, Nirasaki (JP); Hidehito Saegusa, Yamanashi-ken (JP); Jun Ozawa, Yamanashi-ken (JP); Daisuke Hayashi, Yamanashi-ken (JP); Naoki Takayama, Kofu (JP); Koichi Kazama, Nirasaki (JP)

(73) Assignee: Tokyo Electron Limited, Tokyo-To (JP)

(21) Appl. No.: 11/055,788
(22) PCT Filed: Apr. 8, 1998
(86) PCT No.: PCT/JP98/01610

§ 371 (c)(1),
(2), (4) Date: Oct. 5, 1999

(87) PCT Pub. No.: WO98/46808

PCT Pub. Date: Oct. 22, 1998

Related U.S. Patent Documents

Reissue of:
(64) Patent No.: 6,334,983
Issued: Jan. 1, 2002
Appl. No.: 09/402,393
Filed: Oct. 5, 1999

U.S. Applications:
(62) Division of application No. 10/278,863, filed on Oct. 24, 2002, now abandoned.

(30) Foreign Application Priority Data

Apr. 11, 1997 (JP) ..... 9-110472

(51) Int. Cl.
*H01L 21/306* (2006.01)

(52) U.S. Cl. ..... 156/345.34; 29/592.1
(58) Field of Classification Search ..... 29/592.1, 29/825; 156/345.34
See application file for complete search history.

(56) References Cited

U.S. PATENT DOCUMENTS 6,108,189 A 8/2000 Weldon et al. ..... 361/234

FOREIGN PATENT DOCUMENTS

| | | |
|---|---|---|
| JP | 61-67922 | 9/1984 |
| JP | 61-67922 | 4/1988 |
| JP | 2-45629 | 3/1990 |
| JP | 2-61078 | 3/1990 |
| JP | 9-27398 | 1/1997 |

OTHER PUBLICATIONS

International Preliminary Examination Report for PCT/JP98/06610, May 2004.
Supplementary European Search Report, issued in connection with EP 98 91 2715, mailed May 7, 2004.
Patent Abstracts of Japan, Publication No. 08264462, Publication Date: Oct. 11, 1996.

*Primary Examiner*—Kishor Mayekar
(74) *Attorney, Agent, or Firm*—Smith, Gambrell & Russell, LLP

(57) ABSTRACT

A processing system has an upper electrode with gas discharge holes of a shape corresponding to the external we of insulating members. The insulating members are formed of a poly(ether etherketone) resin, a polyimide resin, a poly (ether imide) resin or the like. Each insulating member has a step at its outer surface and an internal longitudinal through hole tapered to expand toward the processing chamber. The insulating members are pressed in the gas discharge holes to bring the steps into contact with shoulders formed in the sidewalls of the gas discharge holes. A part of each insulting member, as fitted in the gas discharge hole, projects from a surface of the upper electrode that faces a susceptor.

8 Claims, 4 Drawing Sheets

PROCESSING SYSTEM

Matter enclosed in heavy brackets [ ] appears in the original patent but forms no part of this reissue specification; matter printed in italics indicates the additions made by reissue.

This application is a *division of application No. 10/278,863, filed Oct. 24, 2002, now abandoned, which is a reissue of U.S. Pat. No. 6,334,983, which resulted from application No. 09/402,393, filed Oct. 5, 1999, which was a* 35 U.S.C. 371 National stage filing of [PCT/JP/98/0160] *PCT/JP98/01610*, filed Apr. 8, 1998. *This application is one of three divisions of co-pending application No. 10/278,863, the other two divisions being co-pending application No. 10/463,439, filed Jun. 18, 2003, and co-pending application No. 10/463,435, also filed Jun. 18, 2003.*

TECHNICAL FIELD

The present invention relates to a processing system, such as an etching system.

BACKGROUND ART

A prior art etching system is provided with an upper electrode and a susceptor serving as a lower electrode disposed opposite to each other in a processing chamber formed in an airtight processing vessel. When subjecting a workpiece to a predetermined etching process by this etching system, the workpiece is mounted on the susceptor, a predetermined process gas is supplied into the processing chamber and the workpiece is etched for the predetermined etching process by a plasma produced in the processing chamber by applying a predetermined radio frequency power across the upper electrode and the susceptor. The process gas is supplied through a gas supply pipe connected to gas sources, for example, into a space defined between the upper electrode and an upper electrode holding member holding the upper electrode, and then the process gas is discharged through a plurality of gas discharge holes formed in the upper electrode into the processing chamber.

Since a surface of the upper electrode facing the susceptor is exposed to the plasma, it is possible that an electric field is concentrated on the gas discharge holes, more specifically on the edges of the gas discharge holes on the side of the processing chamber, whereby the edges of the gas discharge holes are etched and particles are produced. If the particles adhere to the workpiece, the yield of the products of the etching system is reduced. A technique disclosed in, for example, JP-A No. 61-67922 inserts insulating members each provided with a through hole and formed of a ceramic material, such as alumina, or a fluorocarbon resin, such as Teflon in the gas discharge holes to prevent the concentration of an electric field on the gas discharge holes. The gas discharge holes are tapered toward the processing chamber, and the insulating members substantially tapered so as to conform with the tapered gas discharge holes are inserted downward from the upper end of the gas discharge holes in the gas discharge holes. The insulating members are fitted in the gas discharge holes so that the lower end surfaces thereof on the side of the processing chamber are flush with the surface of the upper electrode facing the susceptor. Thus, the insulating members are not caused to fall off the upper electrode toward the lower electrode by the pressure of the process gas, and prevent the concentration of an electric field on the gas discharge holes.

Since the insulating members are inserted in the gas discharge holes from the upper side of the upper electrode, the upper electrode needs to be removed from the processing vessel every time the insulating members are changed and hence the work for changing the insulating members takes much time, the operating time of the etching system is reduced accordingly, reducing the throughput of the etching system. Since the processing chamber is heated at a high temperature during the processing operation of the etching system, thermal stress is induced in the upper electrode. Consequently, the gas discharge holes and the insulating members are strained and, sometimes, the lower end surfaces of the insulating members on the side of the processing chamber are dislocated from a plane including the lower surface of the upper electrode facing the lower electrode.

Sometimes, the edges of the through holes of the insulating member on the side of the processing chamber are etched by the plasma produced in the processing chamber and particles are produced. Since the insulating members are made of alumina or a fluorocarbon resin, it is possible that particles of aluminum or the fluorocarbon resin are produced, and the particles adhere to the workpiece and exert adverse effects, such as the reduction of insulating strength, on the workpiece.

In a processing system provided with an upper electrode comprising an upper electrode member and a cooling plate placed on the upper electrode member, both the upper electrode member and the cooling plate are provided with a plurality of gas discharge holes. In this processing system, a plasma produced in a processing chamber flows through the gas discharge holes formed in the upper electrode member and the gas discharge holes of the cooling plate are damaged by the plasma.

DISCLOSURE OF THE INVENTION

The present invention has been made in view of the foregoing problems in the prior art processing systems and it is therefore an object of the present invention to provide a novel, improved processing system provided with insulating members capable of being easily attached and changed and of being easily and uniformly positioned.

The present invention is applied to a processing system comprising a processing vessel defining an airtight processing chamber, upper and lower electrodes disposed opposite to each other in the processing chamber, and constructed to supply a predetermined process gas through a plurality of gas discharge holes formed in the upper electrode into the processing chamber. According to a first aspect of the present invention, insulating members each provided with a through hole permitting a process gas to pass through are fitted in the gas discharge holes, respectively, from the side of the processing chamber. Since the insulating members are inserted and fitted in the gas discharge holes through the outlet ends (ends on the side of the processing chamber) of the gas discharge holes, the insulating members can easily be attached to the upper electrode and easily be changed.

According to a second aspect of the present invention, the insulating members are fitted in the gas discharge holes of the upper electrode so as to project from the lower surface of the upper electrode facing the lower electrode into the processing chamber. Since lower end parts of the insulating members project from the lower surface of the upper electrode facing the lower electrode, the edges of ends of the gas discharge holes on the side of the processing chamber are not exposed to the processing chamber. Consequently, the edges not exposed to the processing chamber are not etched by a plasma produced in the processing chamber for a processing operation.

According to a third aspect of the present invention, each of the insulating members is provided with a flange capable of covering the rim of an end of the gas discharge hole on the side of the processing chamber. When the insulating members are fitted in the gas discharge holes, respectively, the flanges cover the rims of the ends of the gas discharge holes on the side of the processing chamber. Therefore, the edges of the ends of the gas discharge holes on the side of the processing chamber are not exposed to a plasma produced in the processing chamber and will not be etched. Thus, the life of the upper electrode provided with the gas discharge holes can greatly be extended.

According to a fourth aspect of the present invention, each of the gas discharge holes is provided with a shoulder, each of the insulating members is provided with a step, and the insulating members are fitted in the gas discharge holes so that the insulating members are positioned in place in the gas discharge holes with the steps thereof resting on the shoulders of the corresponding gas discharge holes. Since the insulating members are pressed into the gas discharge holes so that the steps are pressed against the shoulders of the gas discharge holes, the insulating members can correctly be positioned. Consequently, all the insulating members can be positioned at desired positions in the gas discharge holes. Since the steps of the insulating members are in close contact with the shoulders of the gas discharge holes, the plasma is unable to leak into a gas supply passage connected to the gas discharge holes.

According to a fifth aspect of the present invention, at least a part of the sidewall of each of the gas discharge holes between the open end thereof on the side of the processing chamber and the shoulder thereof is finished by a plasma-proofing process, such as an anodic oxidation process if the upper electrode is formed of aluminum. Therefore, the sidewalls of the gas discharge holes are not etched even if the plasma infiltrates into gaps between the sidewalls of the gas discharge holes and the insulating members. Since a part of the sidewall of each gas discharge hole between the shoulder and the open end opening into the gas supply passage is not finished by the plasma-proofing process, the outer surfaces of the insulating members and the sidewalls of the corresponding gas discharge holes are in airtight contact with each other. Therefore, the insulating members will not come off the gas discharge holes even if the pressure of the gas acts on the insulating members.

According to a sixth aspect of the present invention, the length of the insulating members is shorter than that of the gas discharge holes. When each insulating member is fitted in the gas discharge hole, a space is formed between the insulating member fitted in the gas discharge hole and the gas supply passage. Therefore, an optimum conductance can be secured and the process gas can be discharged in a desired mode through the through holes of the insulating members into the processing chamber.

According to a seventh aspect of the present invention, at least a part of the through hole of each insulating member is substantially tapered so as to expand toward the processing chamber. Since any edge is not formed in the open end of through hole on the side of the processing chamber, the insulating members have improved plasma resistance, and insulating member changing period can greatly be extended. Since the parts of the through holes of the insulating members are tapered so as to expand toward the processing chamber, the process gas can uniformly be distributed over a workpiece placed in the processing chamber.

According to an eighth aspect of the present invention, the insulating members are formed of a resin, such as a poly (ether ether ketone) resin of the formula (1), such as PEEK PK-450 commercially available from Nippon Poripenko K.K. or PEEK PK-450G commercially available from The Polymer Corp., a polyimide resin of the formula (2), such as VESPEL SP-1 commercially available from DuPont, or a poly(ether imide) resin of the formula (3), such as ULTEM UL-1000 (natural grade) commercially available from Nippon Poripenko K.K. or The polymer Corp.

(1)

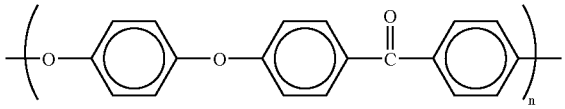

(2)

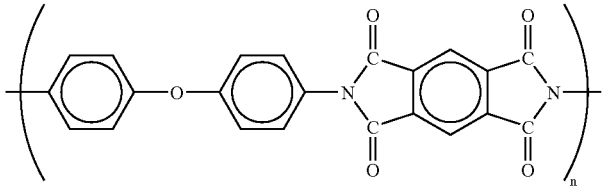

(3)

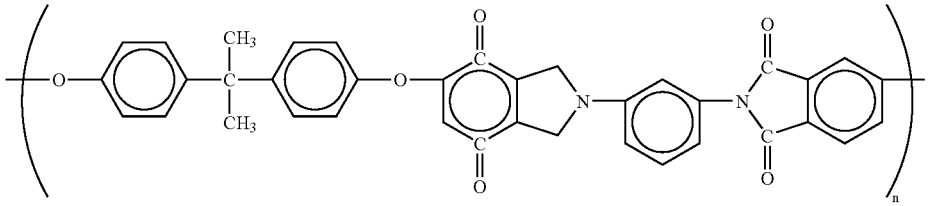

The insulating members has an improved plasma resistance, insulating member changing period can greatly be extended, and influence on the workpiece can be limited to the least extent even if the insulating members are etched by the plasma.

According to a ninth aspect of the present invention, a processing system comprises: a processing vessel having an airtight processing chamber, an upper electrode disposed in an upper region of the processing chamber, and a lower electrode disposed below and opposite to the upper electrode in the processing chamber; wherein the upper electrode has an upper electrode member and a cooling plate disposed on the upper electrode member, the upper electrode member and the cooling plate are provided with a plurality of gas discharge holes through which a predetermined process gas is supplied into the processing chamber, and insulating members each provided with a through hole permitting the process gas to flow through are fitted in the gas discharge holes so as to cover the sidewalls of the gas discharge holes. Thus, it is possible to prevent the etching of the sidewalls of the gas discharge holes of the cooling plate by a plasma produced in the processing chamber.

According to a tenth aspect of the present invention, at least an end part of the through hole of each insulating member on the side of the processing chamber is substantially tapered so as to expand toward the processing chamber. The insulating members provided with the through holes having the substantially tapered parts, respectively, are not easily etched, and insulating member changing period can be extended.

According to an eleventh aspect of the present invention, each of the gas discharge holes of the cooling plate is provided with a shoulder, each of the insulating members is provided with a step, and the insulating members are fitted in the gas discharge holes so that the insulating members are positioned in place in the gas discharge holes with the steps thereof resting on the shoulders of the corresponding gas discharge holes. Since the insulating members are pressed into the gas discharge holes so that the steps are pressed against the shoulders of the gas discharge holes, the insulating members can correctly be positioned. Consequently, all the insulating members can be positioned at a desired position in the gas discharge holes of the cooling plate.

As mentioned above, according to the present invention, the insulating members are fitted in the gas discharge holes, respectively, of the upper electrode from the side of the outlet ends of the gas discharge holes (from the side of the processing chamber). Therefore, the insulating members can easily be attached to and removed from the upper electrode. Since the insulating members are positioned in place in the gas discharge holes with the steps thereof resting on the shoulders of the corresponding gas discharge holes, the insulating members can uniformly be disposed in the gas discharge holes. Since any edge is not formed in a part of each insulating member exposed to the atmosphere of the processing chamber and a part of the through hole of each insulating member is substantially tapered so as to expand toward the processing chamber, the insulating members are not easily etched and insulating member changing period can be extended. The insulating members formed of a predetermined resin have improved plasma resistance and extend insulating member changing period. Since a part of each of the sidewalls of the gas discharge holes between the open end thereof on the side of the processing chamber and the shoulder thereof is finished by a plasma-proofing process, and edges of the open ends of the gas discharge holes on the side of the processing chamber are covered with the insulating members, the life of the upper electrode can be extended.

BEST MODE FOR CARRYING OUT THE INVENTION

Figure 1:
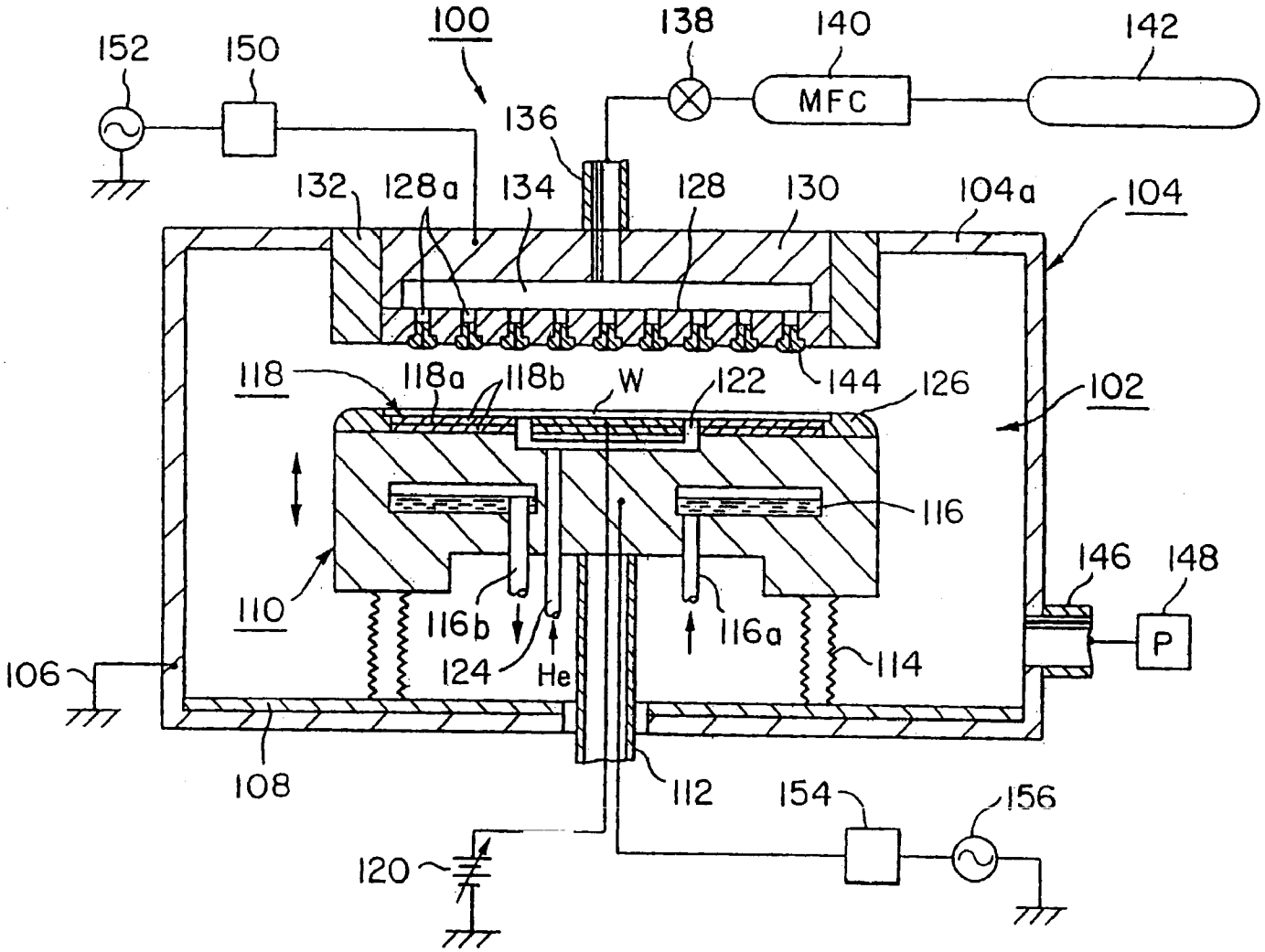
FIG. 1 is a schematic sectional view of an etching system in a first embodiment according to the present invention.

Processing systems in preferred embodiments according to the present invention as applied to etching systems will be described with reference to the accompanying drawings, in which parts of substantially the same functions and the same formation will be designated by the same reference characters and the duplicate description thereof will be omitted.

FIG. 1 is a schematic sectional view of an etching system 100 in a first embodiment according to the present invention. The etching system 100 has a substantially cylindrical processing vessel 104 of, for example, aluminum having surfaces finished by an anodic oxidation process, defining a processing chamber 102 and capable of being sealed in an airtight fashion. The processing vessel 104 is connected to a ground by a grounding line 106. An insulating support plate 108 of, for example, a ceramic material is disposed in the bottom of the processing chamber 102. A substantially cylindrical susceptor 110 serving as a support for supporting a workpiece, such as a 12 in. diameter semiconductor wafer W (hereinafter referred to simply as "wafer") W, and as a lower electrode is disposed on the insulating support plate 108.

The susceptor 110 is supported on a lifting shift 112 extending through the insulating support plate 108 and the bottom wall of the processing vessel 104. The lifting shaft 112 is connected to a driving mechanism, not shown, disposed outside the processing vessel 104. The driving mechanism moves the susceptor 110 in vertical directions as indicated by the arrows in FIG. 1. An elastic airtight sealing member, such as a bellows 114, is extended between the susceptor 110 and the insulating support plate 108 so as to surround the lifting shaft 112.

The susceptor 110 is formed of, aluminum and has surfaces finished by an anodic oxidation process. A coolant circulating passage 116 is formed in the susceptor 110. The coolant circulating passage 116 is connected to a coolant source, not shown, disposed outside the processing vessel 104 by a coolant supply pipe 116a and a coolant discharge pipe 116b. A coolant, such as ethylene glycol, is circulated through the coolant circulating passage and the coolant source. The susceptor 110 is internally provided with a heating device, not shown, such as a ceramic heater, and a temperature sensor, not shown. The heating device, the temperature sensor and the coolant circulating passage 116 cooperate to maintain the wafer W automatically at a desired temperature.

An electrostatic chuck 118 for attracting and holding the wafer W is mounted on a mounting surface of the susceptor 110. The diameter of the electrostatic chuck 118 is substantially equal to that of the wafer W. The electrostatic chuck 118 is formed by sandwiching an electrically conductive thin film 118a such as a tungsten thin film, between insulating members 118b of, for example, a ceramic material. The thin film 118a is connected to a variable dc power supply 120. When a high dc voltage in the range of, for example, 1.0 to 2.5 kV is applied to the thin film 118a by the variable dc power supply 120, Coulomb's force and Johonson-Rahbeck force are generated in the insulating members 118b and electrostatic chuck 118 attracts the wafer W mounted thereon to its support surface and holds the wafer W in place. A plurality of heat transfer gas jetting holes 122 opens in the support surface of the electrostatic chuck 118. The heat transfer gas jetting holes 122 are connected to a heat transfer gas source, not shown, by a heat transfer gas supply pipe 124. When processing the wafer W, a heat transfer gas, such as He gas, is jetted through the heat transfer gas jetting holes 122 into minute spaces between the back surface of the wafer W mounted on the electrostatic chuck 118 and the support surface to transfer heat generated in the wafer W efficiently to the susceptor 110.

The electrostatic chuck 118 is provided with a through hole, not shown, and a lifting pin is inserted in the through hole so as to be vertically movable. The lifting pin can be projected form and retracted beneath the support surface of the electrostatic chuck 118. The lifting pin operates to transfer the wafer W in a desired mode between a carrying arm, not shown, and the support surface.

member 130 are held by a substantially annular insulating ring 132 attached to the top wall 104a of the processing vessel 104.

A recess is formed in a surface of the upper electrode support member 130 facing the upper electrode 128 to define a space 134 between the upper electrode support member 130 and the upper electrode 128 as attached to the upper electrode support member 130. A gas supply pipe 136 is connected to a part of the upper electrode support member 130 corresponding to a central region of the space 134. The gas supply pipe is connected through a valve 138 and a flow controller (MFC) 140 to a gas source 142.

The upper electrode 128 is provided with a plurality of gas discharge holes 128a connecting the space 134 to the processing chamber 102. Insulating members 144 relevant to this embodiment are fitted in the gas discharge holes 128a, respectively.

The insulating members 144 relevant to this embodiment will be described. The insulating members are formed of a plasma-resistant resin, such as a poly(ether ether ketone) resin of the formula (1), a polyimide resin of the formula (2) or a poly(ether imide) resin of the formula (3).

(1)

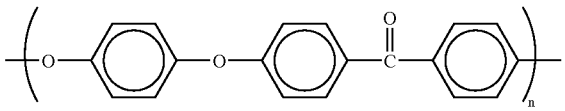

(2)

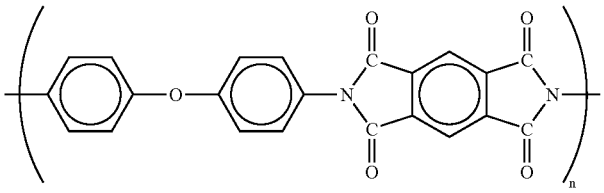

(3)

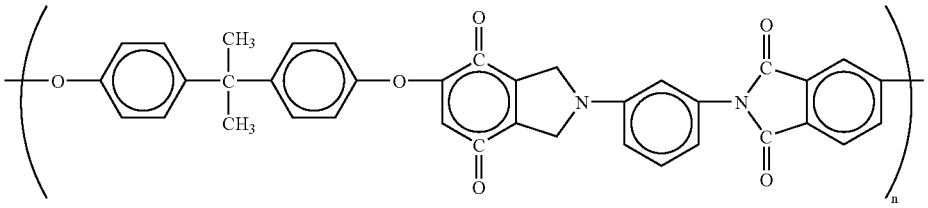

(4) $-(CF_2-CF_2)_n-$ (5) $-(CF_2-CFCl)_n-$

A substantially annular focus ring 126 of, for example, quartz is disposed in a peripheral part of the mounting surface of the susceptor 110 so as to surround the electrostatic chuck 118. The focus ring 126 enables a plasma to fall effectively on the wafer W for the uniform processing of the wafer W.

An upper electrode 128 is disposed opposite to the mounting surface of the susceptor 110. The upper electrode 128 is made of an electrically conductive material, such as aluminum, in a shape substantially resembling a disk, and has surfaces finished by an anodic oxidation process. The upper electrode 128 is attached closely to an upper electrode support member 130 of an electrically conductive material. The upper electrode 128 and the upper electrode support The plasma resistance of the insulating members 144 will be described below. The poly(ether ether ketone) resin of the formula (1), the polyimide resin of the formula (2), the poly(ether imide) resin of the formula (3), a polytetrafluoroethylene resin (fluorocarbon resin) of the formula (4) and a polychlorotrifluoroethylene resin (fluorocarbon resin) of the formula (5) were subjected to etching under the following etching conditions and the etch rates of those resins were measured.

(1) Process gases: $CHF_3$:$CF_4$:Ar=20:40:60 (sccm)

(2) Pressure in the processing chamber: 300 mrTorr (3) Plasma producing radio frequency power: 1.5 kW The etch rate ratios between the measured etch rates of the resins were calculated.

Calculated etch rate ratios (1) Polytetrafluoroethylene/Poly(ether ether ketone)=17.5

(2) Polytetrafluoroethylene/polyimide=16.5

(3) Polytetrafluoroethylene/Poly(ether imide)=14.1

(4) Polychlorotrifluoroethylene/Poly(ether ether ketone)=52.4

(5) Polychlorotrifluoroethylene/Polyimide=49.4

(6) Polychlorotrifluoroethylene/Poly(ether imide)=42.2

It is known from those etch rates that the poly(ether ether ketone) resin, the polyimide resin and the poly(ether imide) resin for forming the insulating members 144, as compared with the polytetrafluoroethylene resin and the polychlorotrifluoroethylene resin, which are fluorocarbon resins, are very highly resistant to etching. It is considered that fluorocarbon resins including the polytetrafluoroethylene resin and the polychlorotrifluoroethylene resin are easily etched because fluorocarbon resins are highly reactive with and easily dissociated by process gases containing fluorine and generally used for etching processes, such as $CF_4$, $CHF_3$ and $CH_2F_2$.

The shape of the insulating members 144, and the shape of the gas discharge holes 128a in which the insulating members 144 are fitted will be described with reference to FIGS. 2 and 3.

Figure 2:
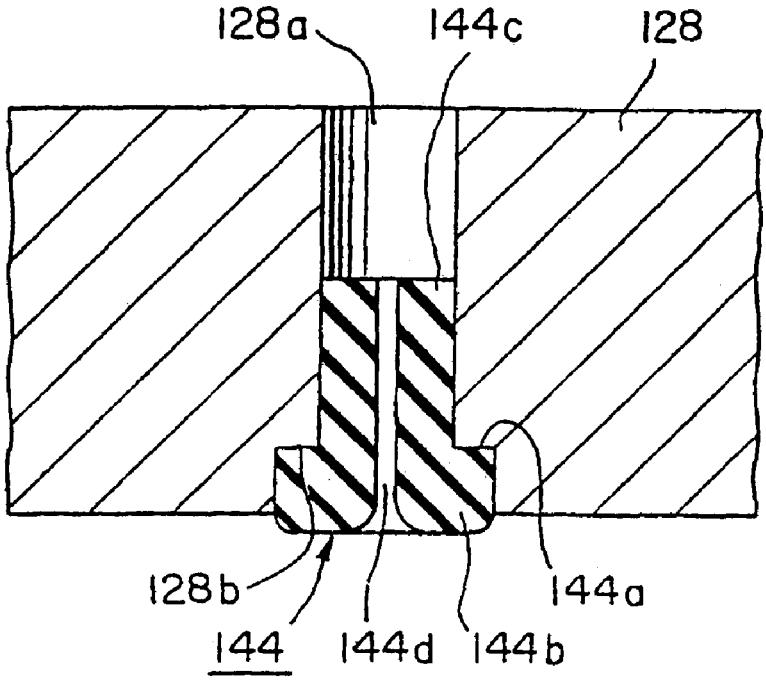
FIG. 2 is a schematic enlarged sectional view of a part of the etching system of FIG. 1 around a gas discharge hole.
Figure 3:
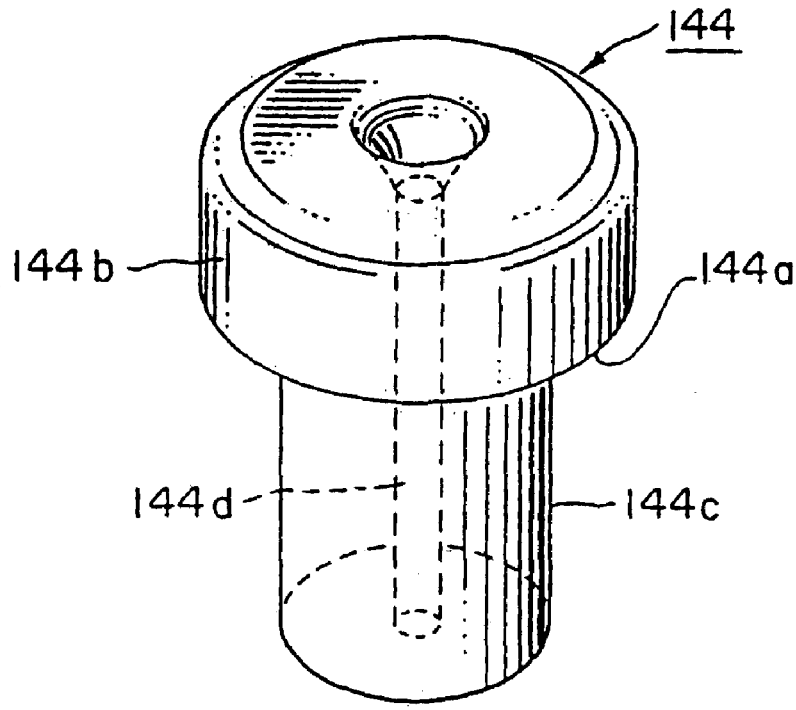
FIG. 3 is a schematic perspective view of an insulating member employed in the etching system of FIG. 1.

The insulating member 144 has a substantially T-shaped longitudinal section as shown in FIG. 2, and is provided with a step 144a as shown in FIGS. 2 and 3. The insulating member 144 has an expanded part 144b of a relatively great diameter on one side of the step 144a, and a reduced part 144c of a relatively small diameter on the other side of the step 144a. The insulating member 144 has a length shorter than that of the gas discharge hole 128a.

The insulating member 144 is provided with a longitudinal through hole 144d. An end part of the through hole 144d opening in the expanded part 144b is substantially tapered so as to expand toward its open end. Therefore, the process gas can be discharged in a desired mode through the through hole 144d, the sidewall of the tapered part of the through hole 144d is hardly etched and hence insulating member changing period at which the insulating members 144 are changed can be extended. Edges of the insulating member 144 which will be exposed to the atmosphere of the processing chamber 102 when the insulating member 144 is fitted in the gas discharge hole 128a are rounded, which further enhances the etch resistance of the insulating member 144 and further extends insulating member changing period.

As shown in FIG. 2, the gas discharge hole 128a has a shape fitting the insulating member 144. A shoulder 128b is formed in the gas discharge hole 128a at a position corresponding to the step 144a of the insulating member 144. A part of the gas discharge hole 128a on the side of the processing chamber 102 with respect to the shoulder 128b has a diameter corresponding to that of the expanded part 144b of the insulating member 144, and another part of the gas discharge hole 128a on the side of the space 134 with respect to the shoulder 128b has a diameter corresponding to that of the reduced part 144c of the insulating member 144. A part of the sidewall of the gas discharge hole 128a between the open end opening into the processing chamber 102 and the shoulder 128b is finished by a plasma-proofing process, such as an anodic oxidation process by which the surfaces of the upper electrode 128 are finished. Therefore, the sidewalls of the gas discharge holes are not etched even if the plasma infiltrates into gaps between the sidewalls of the gas discharge holes 128a and the insulating members 144.

A method of fitting the insulating member 144 in each of the plurality of gas discharge holes 128a will be described below. The insulating member 144 is inserted in the gas discharge hole 128a from the side of the outlet end of the gas discharge hole 128a, i.e., from the side of the processing chamber 102. The insulating member 144 is pressed so that the step 144a of the insulating member 144 comes into contact with the shoulder 128b of the gas discharge hole 128a. Thus, the insulating members 144 can easily be positioned and can uniformly be arranged in the gas discharge holes 128a.

A part of the gas discharge hole 128a between the shoulder 128b and an open end opening into the space 134 is not finished by a plasma-proofing process, because fine irregularities are formed in the sidewall of the gas discharge hole 128a if the sidewall of the gas discharge hole 128a is finished by a plasma-proofing process, such as anodic oxidation process, and the closeness of contact between the sidewall of the gas discharge hole 128a and the outer surface of the reduced part 144c of the insulating member 144 is deteriorated. Thus, the outer surface of the reduced part 144c of the insulating member 144 is in close contact with the sidewall of the gas discharge hole 128a. Consequently, the plasma is unable to infiltrate into gaps between the sidewalls of the gas discharge holes 128a and the insulating members 144, and the insulating members 144 will not be caused to come off the gas discharge holes 128a by the pressure of the process gas.

When the insulating member 144 is fitted in the gas discharge hole 128a, a part of the insulating member 144 projects from a surface of the upper electrode 128 facing the susceptor 110 as shown in FIG. 2. Therefore, the edge of the open end of the gas discharge hole 128a on the side of the processing chamber 102 is not exposed to the plasma produced in the processing chamber 102 and is protected from etching, so that upper electrode changing period at which the upper electrode 128 is changed can be extended. When the insulating member 144 is fitted in the gas discharge hole 128a, a space is formed between the insulating member 144 and the space 134 extending over the upper electrode 128.

Figure 4:
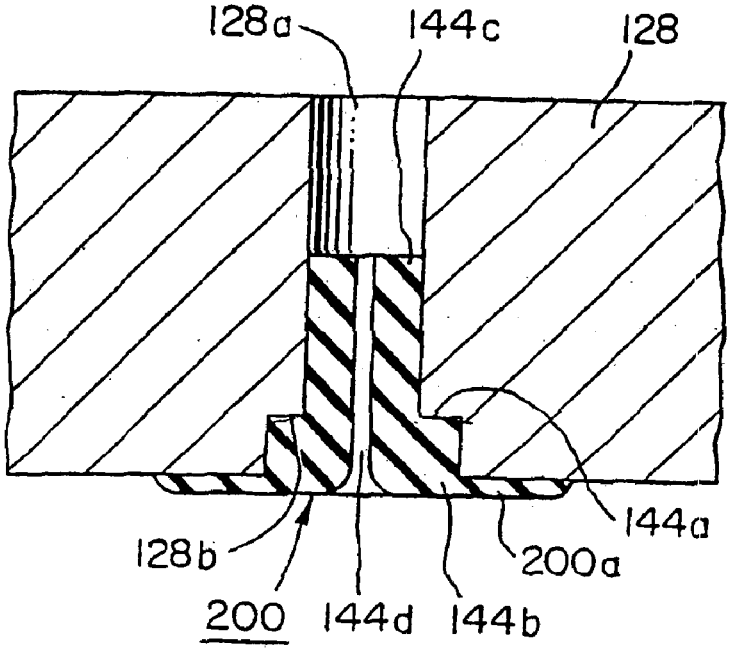
FIG. 4 is a schematic sectional view of am insulating member in a modification of the insulating member shown in FIG. 3.

An insulating member 200 shown in FIG. 4 may be fitted instead of the foregoing insulating member 144 in the gas discharge hole 128a.

The insulating member 200 is formed by additionally providing the insulating member 144 with a flange 200a around the part of the insulating member 144 that projects from the upper electrode 128 into the processing chamber 102 when the insulating member 144 is fitted in the gas discharge hole 128a. The insulating member 200 is substantially identical in shape with the insulating member 144, except that the insulating member 200 is provided with the flange 200a. When the insulating member 200 is fitted in the gas discharge hole 128a, the flange 200a of the insulating member 200 covers closely the edge of an open end of the gas discharge hole 128a on the side of the processing chamber 102 and the rim of the open end of the same. Consequently, the edge of the open end of the gas discharge hole 128a on the side of the processing chamber 102 is not exposed to the plasma and is not etched, which extends the life of the upper electrode 128 provided with the gas discharge holes 128a greatly.

Figure 5:
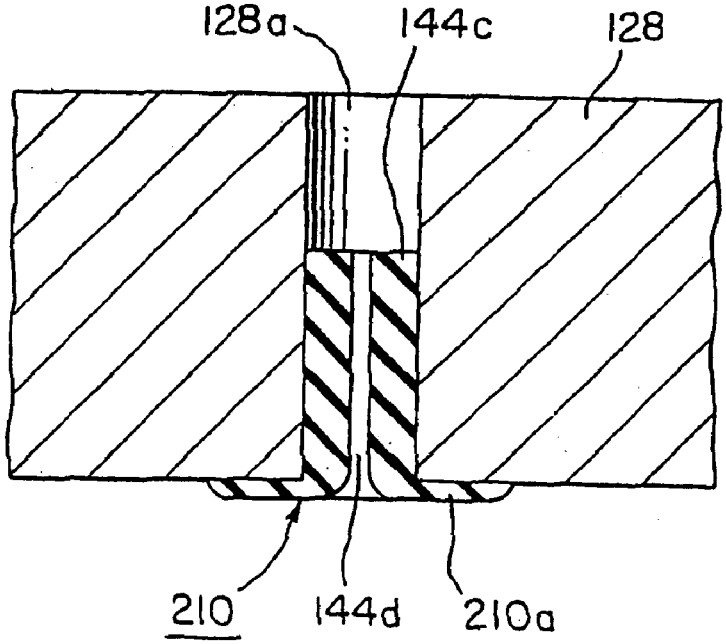
FIG. 5 is a schematic sectional view of an insulating member in another modification of the insulating member shown in FIG. 3.

An insulating member 210 shown in FIG. 5 may be fitted instead of the insulating members 144 and 200 in the gas discharge hole 128a.

The insulating member 210 has a flange 210a corresponding to the flange 200a of the insulating member 200 and does not have any part corresponding to the step 144a of the insulating member 200. The insulating member 200 is positioned by either bringing the step 144a into contact with the shoulder 128b or bringing the flange 200a into contact with the surface of the upper electrode 128. The insulating member 210 is positioned only by bringing the flange 210a into contact with the surface of the upper electrode 128.

When the insulating member 210 is fitted in the gas discharge hole 128a, the flange 210a of the insulating member 210 covers closely the edge of an open end of the gas discharge hole 128a on the side of the processing chamber 102 and the rim of the open end of the same. Consequently, the edge of the open end of the gas discharge hole 128a on the side of the processing chamber 102 is not exposed to the plasma and is not etched, which extends the life of the upper electrode 128 provided with the gas discharge holes 128a greatly.

A method of supplying a process gas into the processing chamber 102 will be described below.

A predetermined process gas, such as a mixed gas of $CF_4$ gas and $O_2$ gas when processing a silicon dioxide film, is supplied from the gas source 142 (FIG. 1) through the gas supply pipe 136 provided with the flow controller (MFC) 140 and the valve 138 into the space 134. The process gas fills up the space 134 and the spaces in the gas discharge holes 128a. Consequently, an optimum conductance can be secured. The process gas flows from the spaces in the gas discharge holes 128a through the through holes 144d into the processing chamber and is distributed uniformly in a desired mode over the wafer W mounted on the susceptor 110.

Referring again to FIG. 1, an exhaust pipe 146 has one end connected to a lower part of the side wall of the processing vessel 104, and the other end connected to a vacuum pump (P) 148, such as a turbo-molecular pump. The vacuum pump 148 operates to evacuate the processing chamber 102 to a predetermined reduced pressure, such as a vacuum in the range of several millitorrs to several hundreds millitorrs and to maintain the predetermined vacuum.

A radio frequency power supply system included in the etching system 100 will be described below. A first radio frequency generator 152 is connected through a first matching circuit 150 to the upper electrode 128. A second radio frequency generator 156 is connected through a second matching circuit 154 to the susceptor 110. In operation, the first radio frequency generator 150 supplies plasma producing radio frequency power of, for example, 13.56 MHz to the upper electrode 128. Then, the process gas supplied into the processing chamber 102 is dissociated and a plasma is produced. At the same time, the second radio frequency generator 156 supplies a predetermined bias radio frequency power of, for example, 380 kHz to the susceptor 110 to attract the plasma effectively to the surface to be processed of the wafer W.

The present invention is not limited to the etching system 100 and may be embodied, for example, in an etching system provided with an upper electrode to which radio frequency power is supplied, and a susceptor and a processing vessel connected to a ground or an etching system provided with a susceptor to which radio frequency power is supplied, and an upper electrode and a processing vessel connected to a ground.

The insulating members 144 of the etching system in this embodiment thus constructed are fitted in the gas discharge holes 128a through the outlet ends thereof on the side of the processing chamber 102. Therefore, the insulating members 144 can easily be changed. Since the insulating members 144 are positioned by bringing the steps 144a thereof into contact with the shoulders 128b of the gas discharge holes 128a, the insulating members 144 can easily be positioned and can uniformly be arranged. Since any edge is not formed in a part of each insulating member 144 exposed to the atmosphere of the processing chamber 102 and a part of the through hole 144d of each insulating member 144 is substantially tapered, the insulating members have improved etch resistance and insulating member changing period can be extended. The insulating members formed of the foregoing resin have improved plasma resistance and extend insulating member changing period. Since a part of the sidewall of each gas discharge hole 128a between the open end thereof on the side of the processing chamber 102 and the shoulder 128b thereof is finished byaplasma-proofing process, and edges of the open ends of the gas discharge holes 128a on the side of the processing chamber 102 are covered with the insulating members 144, upper electrode changing period at which the upper electrode 128 is changed can be extended.

An upper electrode 228 of a construction different from that of the upper electrode 128 of the etching system 100 shown in FIG. 1 will be described with reference to FIGS. 6 and 7.

The upper electrode 228 is applied to an etching system having a plasma processing ability higher than that of the etching system 100 shown in FIG. 1. In the following description, components of the upper electrode 228 substantially the same in function and construction as those of the upper electrode 128 will be designated by the same reference characters and the description thereof will be omitted to avoid duplication.

The upper electrode 228 comprises a silicon electrode (upper electrode member) 301 disposed opposite to a mounting surface of a susceptor 110, and a cooling plate 302 of an aluminum alloy bonded to the upper surface of the silicon electrode 301.

The silicon electrode 301 is provided with a plurality gas discharge holes 301a. The cooling plate 302 is provided with a plurality of gas discharge holes 302a of a diameter greater than that of the gas discharge holes 301a. The gas discharge holes 301a and the gas discharge holes 302 are coaxial, respectively. A space 134 communicates with a processing chamber 102 by means of the gas discharge holes 301a and 302a.

Each of the gas discharge holes 302 has a cylindrical, reduced lower part, and a cylindrical expanded upper part. The reduced lower part and the expanded upper part are demarcated by a shoulder 302b.

Insulating members 244 of the same material as the insulating member 144 are fitted in the gas discharge hole 302a, respectively, so as to be replaceable when damaged.

Figure 7:
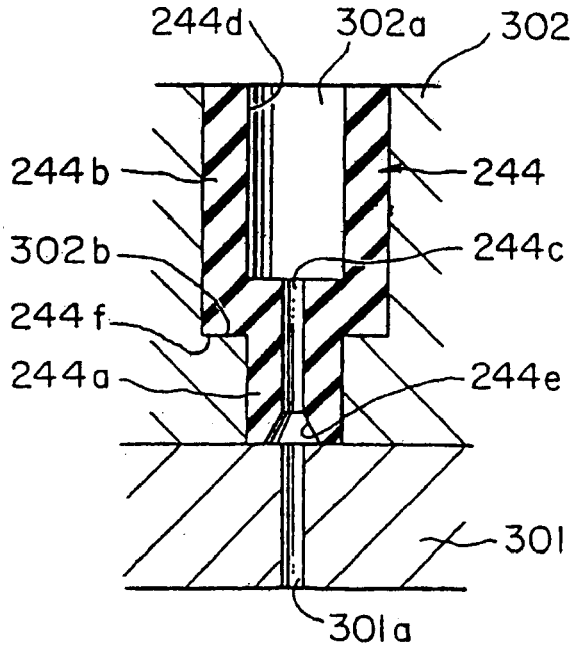
FIG. 7 is an enlarged sectional view of a part of FIG. 6 around a gas discharge hole.

Referring to FIG. 7, the insulating member 244 has a cylindrical, reduced lower part 244a, and a cylindrical expanded upper part 244b. The reduced lower part 244a and the expanded upper part 244b are demarcated by a step 244f. The cylindrical, reduced lower part 244a is fitted in the cylindrical, reduced lower part of the gas discharge hole 302a, and the cylindrical expanded upper part 244b is fitted in the cylindrical, expanded upper part of the gas discharge hole 302a.

The length of the insulating member 244 is approximately equal to the thickness of the cooling plate 302. The lower end surface of the insulating member 244 is substantially in contact with the upper surface of the silicon electrode 301. The length of the insulating member 244 may be smaller than the thickness of the cooling plate 302, provided that the lower end surface of the insulating member 244 is substantially in con tact with the upper surface of the silicon electrode 301. The cylindrical, reduced lower part 244a is provided with a small hole 244c of a diameter substantially equal to that of the gas discharge hole 301a, and the cylindrical, expanded part 244b is provided with a large hole 244d of a diameter greater than that of the small hole 244c.

The small hole 244c has a tapered lower end part 244e expanding toward the lower open end thereof on the side of the gas discharge hole 301a. The tapered end part 244e does not have any edges and has a smooth surface.

The step 244f can be brought into contact with the shoulder 302b to position the insulating member 244 longitudinally on the cooling plate 302.

A part of the sidewall of the gas discharge hole 302a between the shoulder 302b and the upper open end on the side of the space 134 is not finished by a plasma-proofing process, because fine irregularities are formed in the sidewall of the gas discharge hole 302a if the same sidewall is finished by a plasma-proofing process, such as anodic oxidation process, and the closeness of contact between the sidewall of the gas discharge hole 302a and the outer surface of the cylindrical expanded part 244b of the insulating member 244 is deteriorated. Thus, the outer surface of the cylindrical, expanded part 244b of the insulating member 244 is in close contact with the sidewall of the gas discharge hole 302a. Consequently, the plasma is unable to infiltrate into gaps between the sidewalls of the gas discharge holes 302a and the insulating members 244.

In the conventional etching system of this type, a silicon electrode and a cooling plate are provided with gas discharge holes, and any members corresponding to the insulating members 244 are not used. Therefore, the gas discharge holes of the cooling plate are damaged by a plasma produced in a processing chamber 102 and the cooling plate must be changed periodically. Since the insulating members 244 are fitted in the gas discharge holes 302a in the etching system in this embodiment, the etching of the sidewalls of the gas discharge holes 302a by the plasma produced in the processing chamber 102 can be prevented. Therefore, it is necessary to change only the insulating members 244 when necessary and the cooling plate 302 does not need to be changed periodically. Since the lower end parts of the small holes 244c are tapered to form the tapered lower end parts 244e, the sidewalls of the small holes 244c are not etched quickly, and hence insulating member changing period at which the insulating members 244 are changed can be extended.

Figure 6:
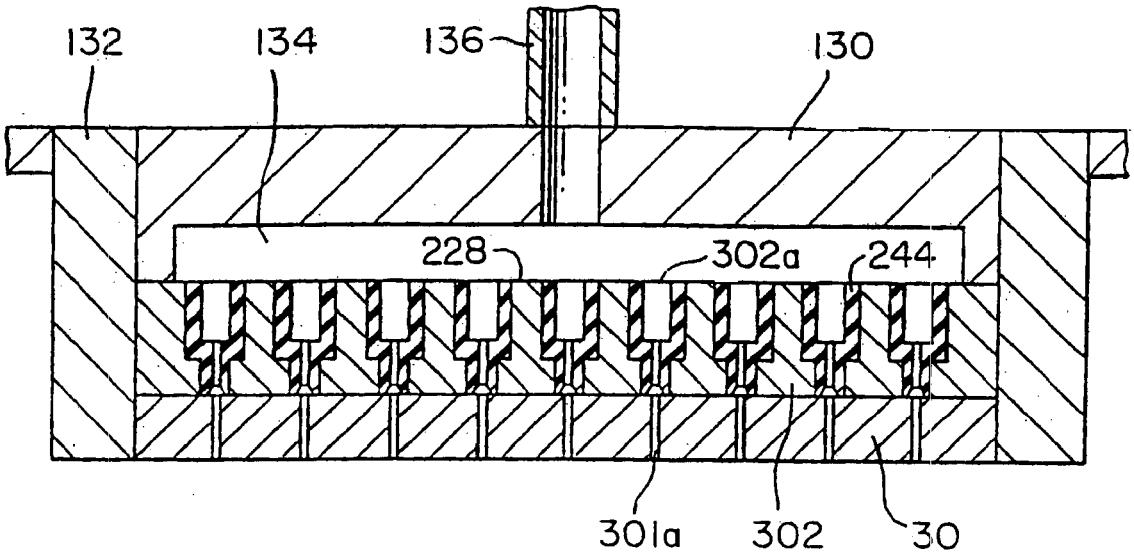
FIG. 6 is a schematic sectional view of a part of an etching system in another embodiment according to the present invention around gas discharge holes.

The insulating members 244 fitted in the gas discharge holes 302a may be of a shape other than that shown in FIGS. 6 and 7, provided that the insulating members are able to cover the sidewalls of the gas discharge holes 302a.

Although the preferred embodiments of the present invention have been described with reference to the accompanying drawings, the present invention is not limited thereto in its practical application. It is obvious to those skilled in the art that many changes and variations are possible without departing from the technical scope of the present invention.

Although the insulating members are fitted in the gas discharge holes in the foregoing embodiment, the present invention is not limited thereto; each of the insulating member may be provided with an expansion extending over the rim of the opening of the gas discharge hole on the side of the processing chamber to cover edges formed in the open end of the gas discharge hole.

Although the insulating members are pressed into the gas discharge holes in the foregoing embodiment, an internal thread what is claimed is:

[1. A processing system comprising:

a processing vessel defining an airtight processing chamber;

an upper electrode disposed in an upper region of the processing chamber;

a lower electrode disposed below and opposite to the upper electrode in the processing chamber; and a radio frequency power source connected at least to either the upper or the lower electrode;

wherein the upper electrode includes a side facing into the processing chamber towards the lower electrode, the upper electrode side having a plurality gas discharge holes to supply a predetermined process gas therethrough into the processing chamber, resin insulating members, each provided with a through hole permitting the process gas to pass through, are fitted from the upper electrode side facing the processing chamber into the gas discharge holes, respectively, each of the gas discharge holes is provided with a shoulder, each of the insulating members is provided with a step, and each of the insulating members are positioned in the gas discharge hole with its step in contact with the shoulder of the gas discharge hole.]

[2. The processing system according to claim 1, wherein the insulating members are fitted in the gas discharge holes of the upper electrode to project into the processing chamber.]

[3. The processing system according to claim 1, wherein each of the insulating members is provided with a flange capable of covering the rim of an end of the gas discharge hole on the side of the processing chamber.]

[4. The processing system according to claim 1, wherein at least part of the sidewall of each of the gas discharge holes between an open end thereof on the side of the processing chamber and the shoulder thereof is finished by a plasma-proofing process, and a part of the sidewall of each gas discharge hole between the shoulder and the open end opening into a gas supply passage is not finished by the plasma-proofing process.]

[5. The processing system according to claim 4, wherein the insulating members are formed of a resin.]

[6. The processing system according to claim 1, wherein each of the insulating members has a length and the length of the insulating members is shorter than that of the gas discharge holes.]

[7. The processing system according to claim 1, wherein at least part of the through hole of each insulating member is substantially tapered so as to expand toward the processing chamber.]

[8. A processing system comprising:

a processing vessel defining an airtight processing chamber;

an upper electrode disposed in an upper region of the processing chamber;

a lower electrode disposed below and opposite to the upper electrode in the processing chamber; and a radio frequency power source connected at least to either the upper or the lower electrode;

wherein the upper electrode has an upper electrode member and a cooling plate disposed on the upper electrode member, the upper electrode member and the cooling plate are provided with a plurality of gas discharge holes through which a predetermined process gas is supplied into the processing chamber, resin insulating members, each provided with a through hole permitting the process gas to flow through, are fitted into the gas discharge holes to cover the sidewalls of the gas discharge holes, each of the discharge holes being formed as a through hole passing through the upper electrode member and the cooling plate, each of the gas discharge holes of the cooling plate is provided with a shoulder, each of the insulating members is provided with a step, and the insulating members are positioned in the gas discharge holes with the steps thereof resting on the shoulders of the corresponding gas discharge holes, each of the insulating members is fitted into the cooling plate from an opposite side to the upper electrode member.]

[9. The processing system according to claim 8, wherein at least an end part of the through hole of each insulating member on the side of the processing chamber is substantially tapered to expand toward the processing chamber.]

*10. A method of use of an upper electrode disposable in an upper region of a processing chamber, said upper electrode provided with a plurality of gas discharge holes to supply a predetermined process gas therethrough into the processing chamber; each of the gas discharge holes provided with a shoulder; and resin insulating members, each provided with a through hole permitting a process gas to pass through and a step, said method comprising the steps of*

*inserting one of said insulating members into one of said gas discharge holes;*

*pressing said one insulating member in said one hole such that said step of said insulating member contacts said shoulder of said one hole such that an edge of said one hole is not exposed to plasma produced in the chamber; and*

*repeating said inserting and pressing steps until all said gas discharge holes of said upper electrode have been provided each with the insulating member.*

*11. The method according to claim 10, wherein said insulating members are pressed into said gas discharge holes to project into the processing chamber.*

*12. The method according to claim 10, wherein each of said insulating members is provided with a flange capable of covering a rim of an end of each of said gas discharge holes.*

*13. The method according to claim 10, further comprising the steps of performing a plasma-proofing process on at least part of a sidewall of each of said gas discharge holes between an open end thereof on a side of the processing chamber and said shoulder thereof, and*

*omitting performance of said plasma-proofing process at a part of said sidewall of each said gas discharge holes between said shoulder and an open-end thereof opening into a gas supply passage.*

*14. The method according to claim 13, further comprising the step of providing resin members as said insulating members.*

*15. The method according to claim 14, wherein said resin insulating members are inserted and pressed into said gas discharge holes, respectively, from a side of the processing chamber.*

*16. The method according to claim 10, further comprising the steps of providing said insulating members so that they have a length that is relatively shorter than that of said gas discharge holes.*

*17. The method according to claim 10, further comprising the step of providing said insulating members so that at least part of the through hole of each said insulating members is substantially tapered to expand toward said processing chamber.*

* * * * *